United States Patent
Ooyama et al.

(10) Patent No.: US 10,714,864 B2
(45) Date of Patent: Jul. 14, 2020

(54) CONNECTOR

(71) Applicant: Yazaki Corporation, Minato-ku, Tokyo (JP)

(72) Inventors: Kouichi Ooyama, Makinohara (JP); Takumi Nakagishi, Makinohara (JP)

(73) Assignee: Yazaki Corporation, Minato-ku, Tokyo (JP)

( * ) Notice: Subject to any disclaimer, the term of this patent is extended or adjusted under 35 U.S.C. 154(b) by 0 days.

(21) Appl. No.: 16/413,098

(22) Filed: May 15, 2019

(65) Prior Publication Data

US 2019/0363478 A1  Nov. 28, 2019

(30) Foreign Application Priority Data

May 25, 2018  (JP) .................. 2018-100702

(51) Int. Cl.
*H01R 13/50* (2006.01)
*H01R 13/405* (2006.01)
*H05K 5/00* (2006.01)

(52) U.S. Cl.
CPC ........... *H01R 13/50* (2013.01); *H01R 13/405* (2013.01); *H05K 5/0069* (2013.01)

(58) Field of Classification Search
CPC .. H01R 13/50; H01R 13/405; H01R 13/4361; H01R 13/5219; H01R 13/6658; H05K 5/0069
See application file for complete search history.

(56) References Cited

U.S. PATENT DOCUMENTS

| | | | | |
|---|---|---|---|---|
| 5,346,406 A | * | 9/1994 | Hoffman | B60L 53/305 439/474 |
| 2001/0017767 A1 | | 8/2001 | Kitamura et al. | |
| 2005/0020104 A1 | * | 1/2005 | Yamamoto | H01R 13/4361 439/76.1 |
| 2007/0099486 A1 | * | 5/2007 | Kameyama | H01R 13/6477 439/498 |
| 2011/0059659 A1 | * | 3/2011 | Matsumoto | H01R 13/426 439/733.1 |
| 2012/0058660 A1 | * | 3/2012 | Aoki | H01R 13/5205 439/272 |
| 2012/0064782 A1 | * | 3/2012 | Kitajima | H01R 13/521 439/751 |
| 2012/0094523 A1 | | 4/2012 | Hashimoto et al. | |
| 2016/0294103 A1 | | 10/2016 | Yoshigi | |

FOREIGN PATENT DOCUMENTS

| | | |
|---|---|---|
| EP | 2429041 A1 | 3/2012 |
| JP | 2017-092281 A | 5/2017 |

* cited by examiner

*Primary Examiner* — Edwin A. Leon
(74) *Attorney, Agent, or Firm* — Banner & Witcoff, Ltd.

(57) ABSTRACT

A connector includes an outer tube, an inner tube formed to be continuous from the outer tube, and a partition wall configured to isolate the outer tube and the inner tube. The partition wall has an elongate convex portion, the convex portion is formed on a surface of the partition wall in a side of the outer tube, and the convex portion has a through hole penetrating the partition wall which is formed in the convex portion and a terminal is press-fitted into the through hole.

7 Claims, 3 Drawing Sheets

CONNECTOR

CROSS-REFERENCE TO RELATED APPLICATIONS

This application is based on and claims priority under 35 USC 119 from Japanese Patent Application No. 2018-100702 filed on May 25, 2018, the contents of which are incorporated herein by reference.

TECHNICAL FIELD

The present disclosure relates to a connector, and more particularly to a connector including terminals connected to a printed circuit board.

BACKGROUND ART

An electronic control device in the related art includes a printed circuit board on which electronic components are mounted, a housing (the same as a storage case) that stores the printed circuit board, and a connector (hereinafter, referred to as "PCB connector") including a plurality of terminals connected to the printed circuit board. The PCB connector has a tubular shape and includes a partition wall that isolates the housing from outside of the housing. Reference Document 1 discloses the terminals penetrate the partition wall in a liquid-tight manner.

Reference Document 1: JP 2017092281 A (pages 5 to 8, FIG. 2)

According to Reference Document 1 (board connector), a surface of the partition wall outside the housing is flat, and the terminals are press-fitted into through holes in the partition wall. For this reason, tensile stress is generated on inner peripheries of the through holes, and is particularly concentrated at positions close to the surface outside the housing in a range where the through holes abut corner portions of cross sections of the terminals. The tensile stress is further concentrated since the stress increases or decreases with temperature changes, which may cause a crack at the positions where the stress is concentrated.

SUMMARY OF INVENTION

The present disclosure relates to a PCB connector that would reduce risks of cracks.

Aspects of certain non-limiting embodiments of the present disclosure address the features discussed above and/or other features not described above. However, aspects of the non-limiting embodiments are not required to address the above features, and aspects of the non-limiting embodiments of the present disclosure may not address features described above.

According to an aspect of the present disclosure, there is provided a connector including: an outer tube; an inner tube formed to be continuous from the outer tube; and a partition wall configured to isolate the outer tube and the inner tube, in which the partition wall has an elongate convex portion, the convex portion is formed on a surface of the partition wall in a side of the outer tube, and the convex portion has a through hole penetrating the partition wall which is formed in the convex portion and a terminal is press-fitted into the through hole.

In the PCB connector according to the present disclosure, the terminal is press-fitted into the convex portion formed on the surface of the partition wall facing the outer tube. Accordingly, concentration of tensile stress is reduced at a position close to the surface facing the outer tube in a range where the terminal abuts the partition wall, and risks of cracks are reduced.

BRIEF DESCRIPTION OF DRAWINGS

Exemplary embodiments of the present disclosure will be described in detail based on the following figures, wherein:

FIGS. 5A and 5B schematically illustrate the PCB connector according to the first embodiment, in which FIG. 5A is a partially enlarged side cross-sectional view schematically illustrating operation effects, and FIG. 5B is a partially enlarged cross-sectional view illustrating the related art for comparing operational effects.

DESCRIPTION OF EMBODIMENTS

Hereinafter, a PCB connector according to a first embodiment is described with reference to drawings. The drawings are schematically illustrated, and shapes, sizes, or positional relationships between members are not limited to the illustrated embodiment.

First Embodiment

Figure 1:
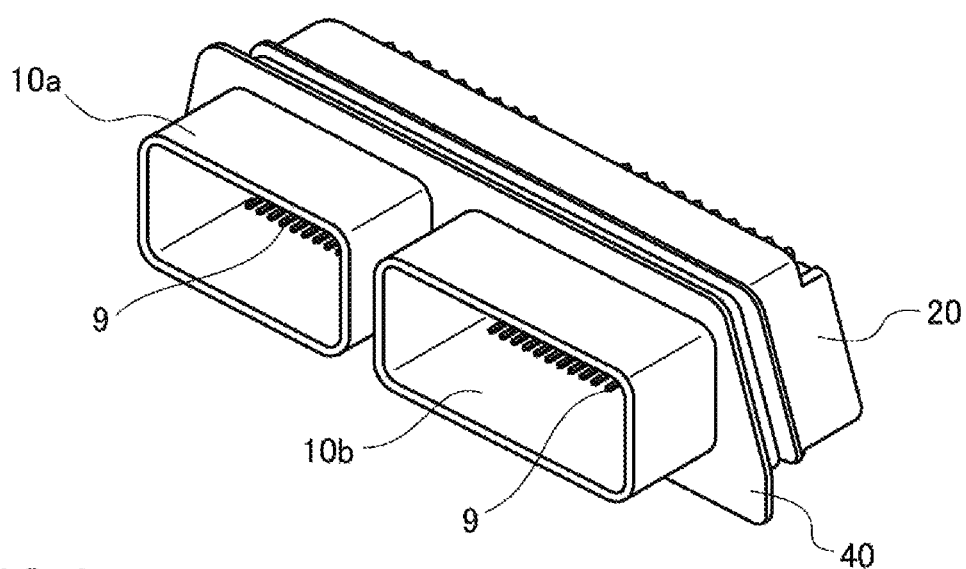
FIG. 1 is a perspective view schematically illustrating a PCB connector according to a first embodiment.
Figure 2:
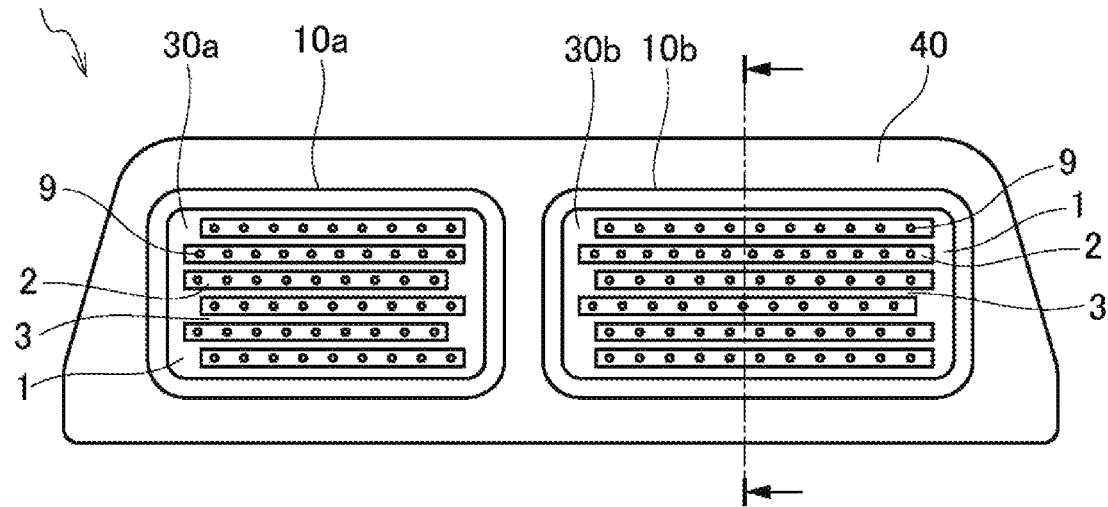
FIG. 2 is a plan view schematically illustrating the PCB connector according to the first embodiment.
Figure 3:
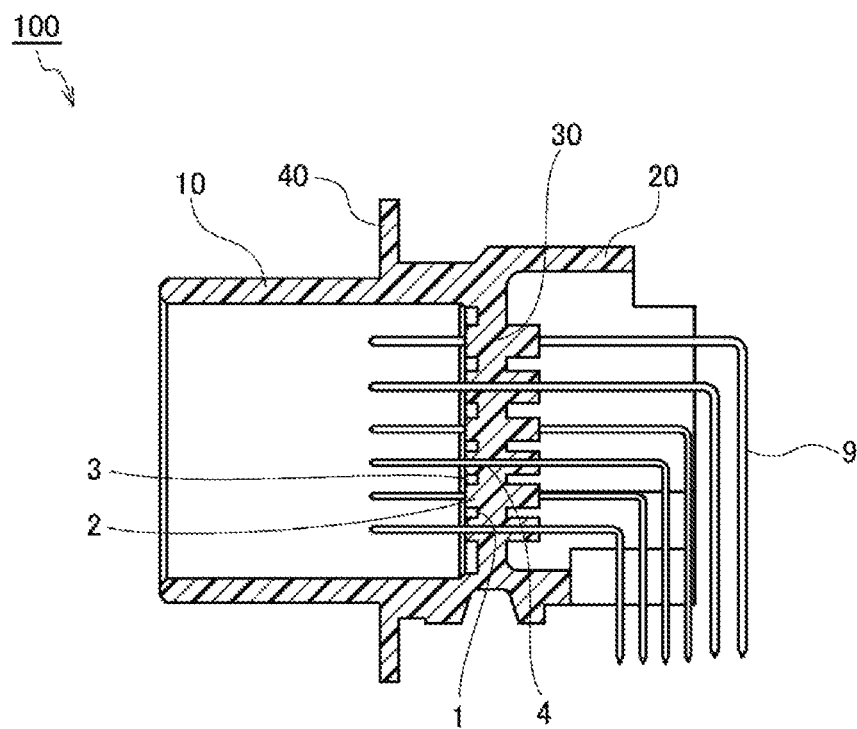
FIG. 3 is a side cross-sectional view schematically illustrating the PCB connector according to the first embodiment.
Figure 4:
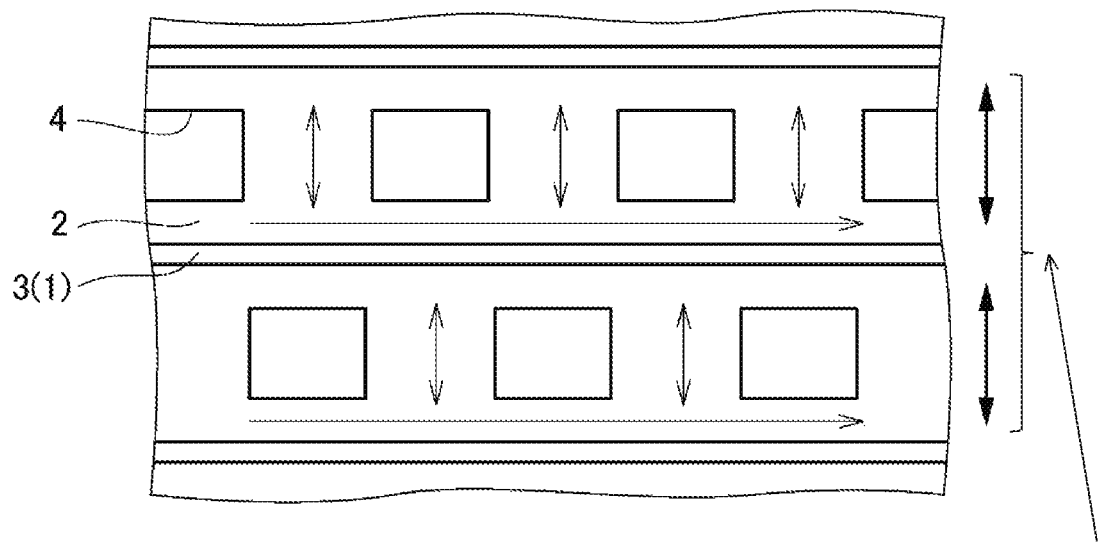
FIG. 4 is a partially enlarged plan view schematically illustrating a resin flow that schematically illustrates the PCB connector according to the first embodiment.
Figure 5A:
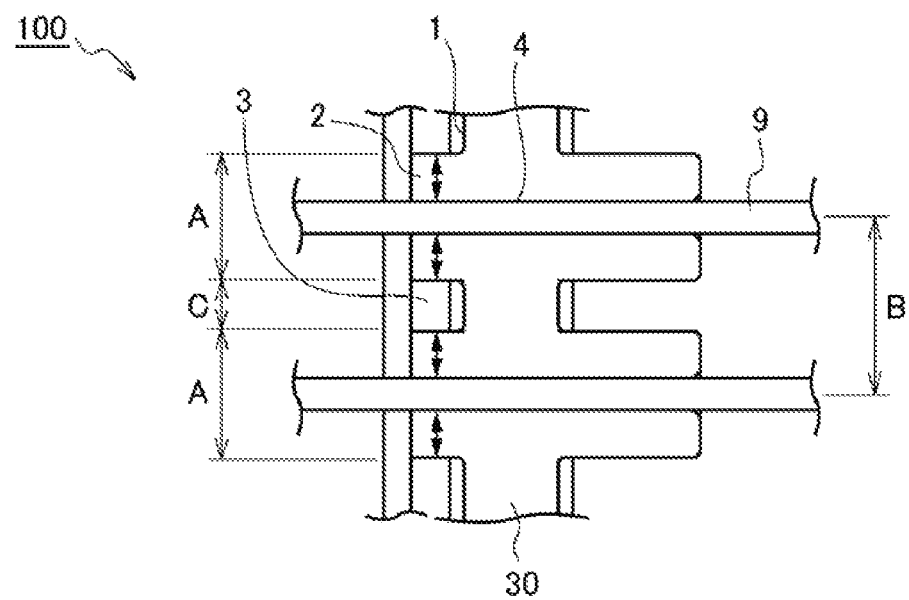
Figure 5B:
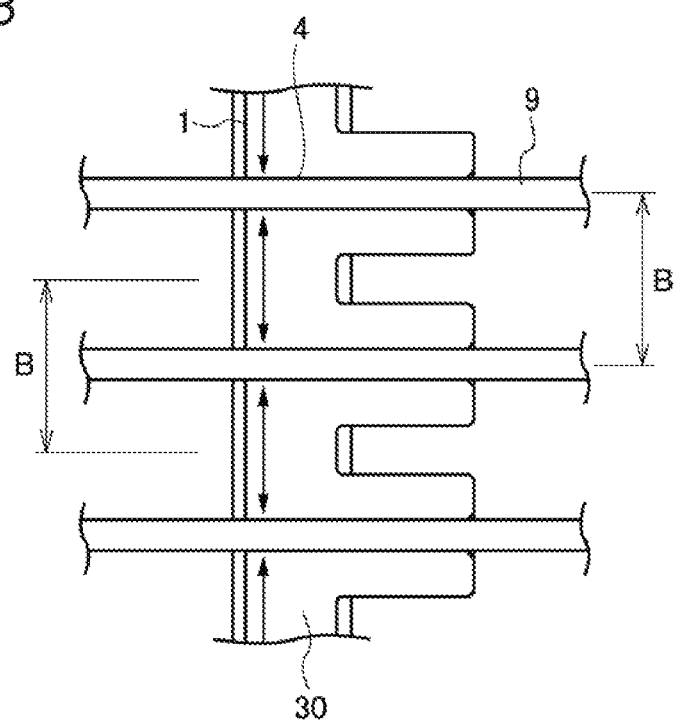

FIGS. 1 to 4 schematically illustrate the PCB connector according to the first embodiment. FIG. 1 is a perspective view, FIG. 2 is a plan view, FIG. 3 is a side cross-sectional view, FIG. 4 is a partially enlarged plan view schematically illustrating a resin flow, FIG. 5A is a partially enlarged side cross-sectional view schematically illustrating operation effects, and FIG. 5B is a partially enlarged cross-sectional view illustrating the related art for comparing operational effects.

In FIGS. 1 to 3, a PCB connector 100 is a resin molded body mixed with glass fiber pieces. The PCB connector 100 is provided in an opening of a housing (not illustrated) that stores a printed circuit board on which electronic components are mounted.

That is, the PCB connector 100 includes a first outer tube 10a and a second outer tube 10b outside the housing, an inner tube 20 inside the housing, the inner tube 20 being continuous from the first outer tube 10a and the second outer tube 10b, a first partition wall 30a that isolates the first outer tube 10a and the inner tube 20, and a second partition wall 30b that isolates the second outer tube 10b and the inner tube 20. The PCB connector 100 further includes a common flange 40 on outer peripheries of the first outer tube 10a and the second outer tube 10b. The common flange 40 is configured to be provided to the housing.

Terminals 9 penetrate the first partition wall 30a and the second partition wall 30b, respectively.

Hereinafter, name modifiers "first" "second" and numeral suffixes "a" "b" are omitted since the first outer tube 10a and the second outer tube 10b, as well as the first partition wall 30a and the second partition wall 30b, have the same basic structure. The present disclosure does not limit the number of outer tubes 10 (partition walls 30).

A surface (hereinafter, referred to as "partition wall outer surface 1") of a partition wall 30 facing an outer tube 10 are formed with a plurality of elongate convex portions 2 extending in a direction substantially parallel to a direction in which a resin flows (schematically indicated with arrows, and referred to as "flow direction", hereinafter) when the partition wall 30 is formed. Adjacent two convex portions 2 define a groove 3 in which the partition wall outer surface 1 is exposed.

Further, through holes 4 penetrating the partition wall 30 are formed in the convex portions 2, and the terminals 9 are press-fitted into the through holes 4. That is, the plurality of terminals 9 appear to be linear "rows" in the flow direction. The rows appear to be a plurality of "columns" in a direction (hereinafter, referred to as a "flow perpendicular direction") perpendicular to the flow direction.

In FIG. 4, the resin forming the partition wall 30 flows generally from left to right of the drawing at time of molding, as schematically indicated by the arrows. At this time, glass fibers mixed in the resin are also oriented in the direction indicated by the arrows. As a result, an expansion and contraction amount of the partition wall 30 in case of a thermal fluctuation is small in the flow direction, and is large in the flow perpendicular direction. A force in the flow direction that acts on the partition wall 30 stretches or shrinks the glass fibers, and a force in the flow perpendicular direction widens or shortens a distance between the glass fibers (also including a case where entanglements are undone since the glass fibers may entangle with each other). For this reason, since a crack occurs due to the force in the flow perpendicular direction. A deformation and the force in the flow perpendicular direction is discussed below The resin does not undergo precisely a simple flow since it goes around to a downstream side of a mold (not illustrated, and is the same as a pin for molding) used for molding the through holes 4. That is, arrows with arrowheads drawn at both ends in FIG. 4 indicate that the resin flows in two directions from one of the rows to the other of the rows and from the other of the rows to the one of the rows, respectively. Therefore, the arrows does not indicate only a flow parallel to the flow perpendicular direction.

In FIG. 5A, when the terminals 9 are press-fitted into the through holes 4, the terminals 9 push outward portions of the convex portions 2 having a width A. Accordingly, the terminals 9 can be analogized to be held by the portions of the convex portions 2 having the width A.

In contrast to a case without the convex portions 2 (hereinafter, referred to as "related art") in FIG. 5B, when the terminals 9 are press-fitted into the through holes 4, in a range where the through holes 4 are close to the partition wall outer surface 1, the terminals 9 push outward portions having a width B which is a distance between the terminals 9 is width B. Accordingly, the terminals 9 can be analogized to be held by the portions having the width B.

As a result, the terminals 9 in the present disclosure are held by a force smaller than that of the terminals 9 in the related art with the same press-fitting margin (i.e., the same fit tolerance) since width A is smaller than width B. That is, in the inner peripheries of the through holes 4, a stress of the present disclosure occurred in the convex portions 2 is smaller than a stress of the related art occurred without the convex portions 2 in a range where the through holes 4 are close to the partition wall outer surface 1. In the present disclosure, this can be interpreted that the deformation is released in the groove 3 (a portion having width C) between the convex portions 2.

During temperature changes, the portions having the width A in the present disclosure and the portions having width B in the related art are deformed in the same manner. At this time, the deformation is released in the groove 3 (the portion having the width C), which is similar to that during the press-fitting. Accordingly, the stress occurred in the inner peripheries of the through holes 4 in the convex portions 2 in the present disclosure is smaller than that in the related art.

As described above, during repeated temperature changes, the inner peripheries of the through holes 4 in the present disclosure repeatedly receives a load with smaller a stress amplitude at an average tensile stress smaller than in the related art, so that risks of cracks are reduced.

The present invention is described above based on the first embodiment. It should be understood by those skilled in the art that the first embodiment is merely an example, and various modifications can be made to components in the first embodiment and combinations thereof, which are also within the scope of the present invention.

The present invention is described above, and can be widely applied to various PCB connectors.

REFERENCE SIGNS LIST 1 partition wall outer surface
2 convex portion
3 groove
4 through hole
9 terminal
10 outer tube
10a first outer tube
10b second outer tube
20 inner tube
30 partition wall
30a first partition wall
30b second partition wall
40 flange
100 PCB connector

What is claimed is:
1. A connector comprising:
an outer tube;
an inner tube formed to be continuous from the outer tube; and
a partition wall configured to isolate the outer tube and the inner tube,
wherein the partition wall has an elongate convex portion,
wherein the convex portion is formed on a surface of the partition wall in a side of the outer tube,
wherein the convex portion has a through hole penetrating the partition wall which is formed in the convex portion, and a terminal is press-fitted into the through hole, wherein the convex portion is elongate in a second direction perpendicular to a first direction in which the through hole penetrates the partition wall,
wherein the connector is made of the resin mixed with a glass fiber piece, and
wherein the glass fiber piece is oriented in substantially parallel with the second direction in which the convex portion is elongate.
2. The connector according to claim 1, wherein the connector is provided in a housing that stores a printed circuit board,
wherein the outer tube is configured to be disposed outside the housing, and wherein the inner tube is configured to be disposed inside the housing.

3. The connector according to claim 1, wherein a further terminal is press-fitted into a further through hole,
wherein the convex portion has a first width in a direction perpendicular to a direction in which the convex portion extends,
wherein a distance between the terminal and said further terminal has a second width in the direction perpendicular to the direction in which the convex portion extends, and
wherein the first width is smaller than the second width.

4. The connector according to claim 1, wherein the partition wall includes another elongate convex portion, the elongate convex portion and the another elongate convex portion being parallel to one another in a plane defined by the surface of the partition wall.

5. The connector according to claim 1, wherein the elongate convex portion includes a plurality of through holes penetrating therethrough, and
wherein the elongate convex portion is continuous among the plurality of through holes.

6. The connector according to claim 1, wherein the partition wall includes another elongate convex portion, the another elongate convex portion being elongate in the second direction perpendicular to the first direction in which the through hole penetrates the partition wall, and
wherein the elongate convex portion and the another elongate convex portion are opposite to each other across the partition wall.

7. A connector comprising:
an outer tube;
an inner tube formed to be continuous from the outer tube; and
a partition wall configured to isolate the outer tube and the inner tube,
wherein the partition wall has an elongate convex portion,
wherein the convex portion is formed on a surface of the partition wall in a side of the outer tube,
wherein the convex portion has a through hole penetrating the partition wall which is formed in the convex portion, and a terminal is press-fitted into the through hole, wherein the convex portion is elongate in a second direction perpendicular to a first direction in which the through hole penetrates the partition wall, and
wherein the partition wall includes another elongate convex portion, the elongate convex portion and the another elongate convex portion being parallel to one another in a plane defined by the surface of the partition wall.

\* \* \* \* \*